United States Patent
Nakata et al.

(10) Patent No.: US 6,778,232 B2
(45) Date of Patent: Aug. 17, 2004

(54) METHOD FOR MANUFACTURING ACTIVE MATRIX SUBSTRATE

(75) Inventors: Shinichi Nakata, Izumi (JP); Yuji Yamamoto, Izumi (JP); Takayuki Ishino, Izumi (JP)

(73) Assignee: NEC LCD Technologies, Ltd., Kanagawa (JP)

( * ) Notice: Subject to any disclaimer, the term of this patent is extended or adjusted under 35 U.S.C. 154(b) by 87 days.

(21) Appl. No.: 10/188,743

(22) Filed: Jul. 5, 2002

(65) Prior Publication Data

US 2003/0013236 A1 Jan. 16, 2003

(30) Foreign Application Priority Data

Jul. 13, 2001 (JP) .................................. 2001-214129

(51) Int. Cl.[7] .............................................. G02F 1/136
(52) U.S. Cl. ........................... 349/43; 349/42; 349/187; 257/59; 257/72
(58) Field of Search ........................... 349/43, 42, 187; 257/59, 72

(56) References Cited

U.S. PATENT DOCUMENTS 5,818,551 A * 10/1998 Park ............................. 349/43
6,072,550 A * 6/2000 Kim ............................. 349/40
6,169,593 B1 * 1/2001 Kanaya et al. ............... 349/187
6,188,461 B1 * 2/2001 Moon .......................... 349/187
6,400,425 B1 * 6/2002 Kim et al. .................... 349/40
6,445,432 B2 * 9/2002 Yamamoto et al. ......... 349/106
6,577,374 B1 * 6/2003 Nakata et al. ............... 349/156
6,587,160 B2 * 7/2003 Lee et al. ..................... 349/40
6,600,546 B1 * 7/2003 Ahn et al. .................... 349/187

FOREIGN PATENT DOCUMENTS

JP          2000-231123        8/2000

* cited by examiner

Primary Examiner—Jared J. Fureman
Assistant Examiner—Allyson N. Trail
(74) Attorney, Agent, or Firm—Young & Thompson

(57) ABSTRACT

In a step for forming a contact through hole in a protective film that covers a Thin Film Transistor (TFT) to connect a source electrode of the TFT and a pixel electrode to each other, location of a later-formed contact through hole is designed to be apart not less than 2.0 $\mu$m from location of the opening of an overcoat layer, which opening is formed on the protective film. This construction forces the opening of a novolac type photosensitive resist to be positioned inside the location of the opening of the overcoat layer and therefore, the contact through hole formed in the protective film is able to have a tapered cross sectional profile that is never affected by the opening of the overcoat layer, allowing for stable connection between the source electrode and the pixel electrode.

10 Claims, 9 Drawing Sheets

FIG. 1 (PRIOR ART)
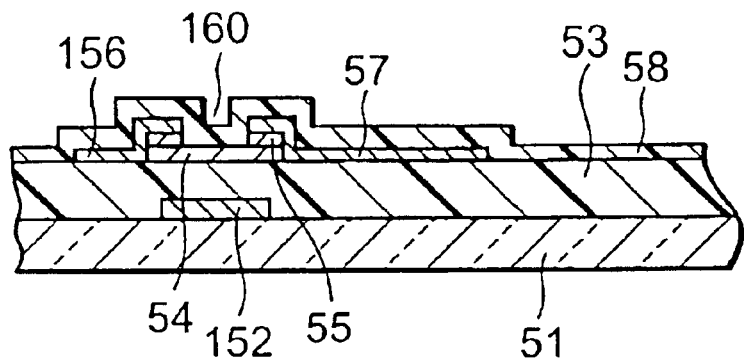
FIG. 1A
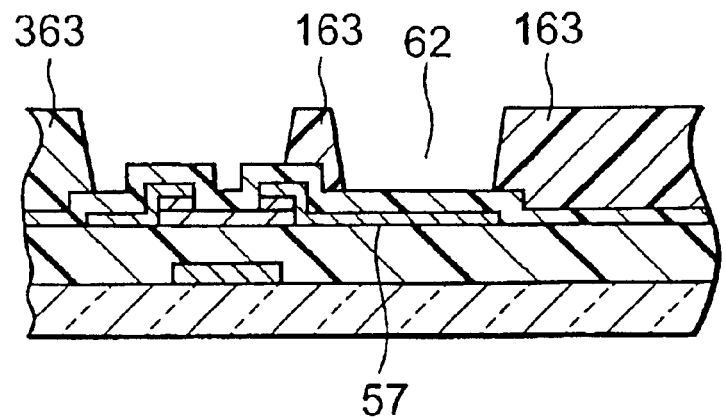
FIG. 1B
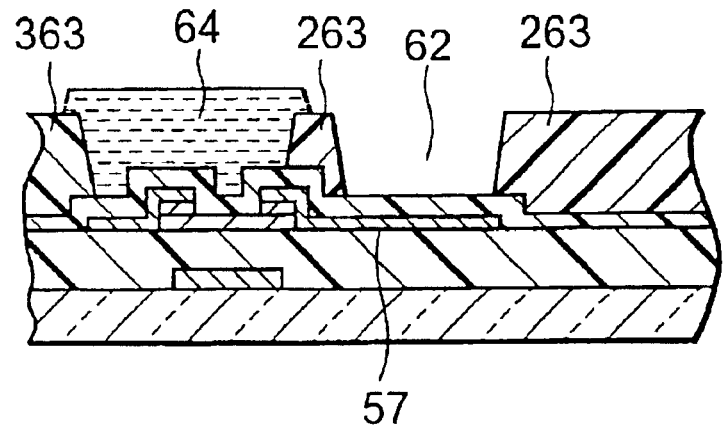
FIG. 1C

FIG. 2(PRIOR ART)
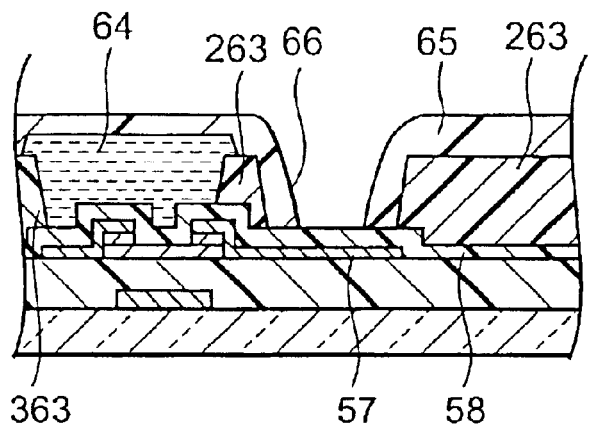
FIG. 2A
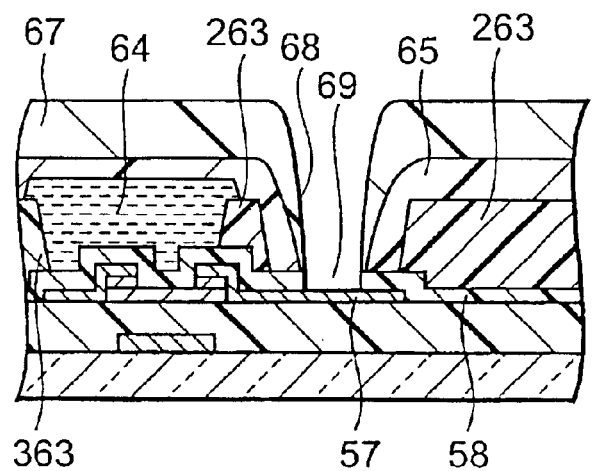
FIG. 2B
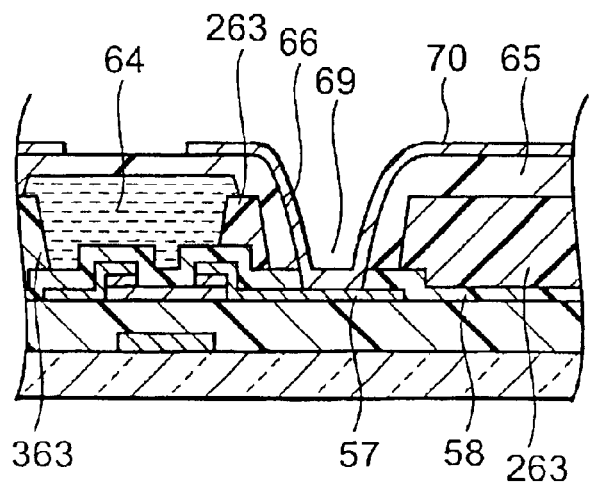
FIG. 2C

METHOD FOR MANUFACTURING ACTIVE MATRIX SUBSTRATE

BACKGROUND OF THE INVENTION

1. Field of the Invention

The present invention relates to a method for manufacturing an active matrix substrate employed in a liquid crystal display device, and more particularly to a method for manufacturing a Thin Film Transistor (TFT) substrate provide with a Color Filter (CF).

2. Description of the Prior Art

In a conventional twisted nematic (TN) type liquid crystal color display device, a liquid crystal is interposed between a TFT substrate and a Color Filter (CF) substrate. In such a liquid crystal display device, a black matrix is generally provided on the CF substrate to prevent degradation of images to be displayed. Taking into account misalignment between the CF substrate and the TFT substrate, the black matrix has to be formed wide enough to securely prevent a light from leaking through the liquid crystal. Accordingly, an aperture ratio of liquid crystal display device becomes small and transmittance thereof becomes low.

As one of technologies for enlarging an aperture ratio to solve the above-stated problems, the Japanese Patent Application No. 10-351637 (hereinafter, referred to as a conventional example) discloses a method for manufacturing a color filter on a TFT (the TFT substrate provided with a Color Filter). FIGS. 1 and 2 are cross-sectional views of a TFT substrate provided with a CF in which a TFT is protected by a passivation film and used as a switching element, illustrating steps for manufacturing the TFT. The structure of a TFT provided with a CF will be described with reference to FIGS. 1 and 2.

First, a TFT 160 in which a channel thereof is formed by etching is formed on a transparent insulating substrate 51, and an entire surface of the substrate including the TFT 160 is covered by a passivation film 58. The passivation film 58 is formed by, for example, depositing a silicon nitride using plasma CVD (FIG. 1A).

Next, a negative type photocurable color resist obtained by dispersing a red pigment in an acryl resin is spin-coated on the transparent insulating substrate 51. The rotational speed of a spinner is adjusted to make a film thickness of the resist about 1.2 μm. Then, the substrate 51 having the resist formed thereon is heated on a hot plate for two minutes at a temperature of 80° C. in a pre-baking step, and exposed and further, developed in a TMAH solution (tetramethylammonium hydroxide) to form a red color filter 163 in an associated portion on the substrate 51 (FIG. 1B). In this case, the red color filter 163 is formed such that the red color filter is not formed on a part 62 of the passivation film 58 in which part a third opening will be formed later in the passivation film. Then, the substrate 51 is baked in a clean oven for 60 minutes at a temperature of 220° C. to cure the red color filter 163.

Thereafter, a green color filter 263 is formed in another pixel, in which a color filter other than the red color filter is to be formed, in accordance with the same manner as in the case where the red color filter has been formed. The substrate 51 is baked in an oven for 60 minutes at a temperature of 220° C. to obtain the green color filter 263. A blue color filter 363 is also formed in accordance with the same manner as in the case where the red color filter has been formed.

Subsequently, after completion of formation of color filters, a black matrix 64 is formed (FIG. 1C). The black matrix 64 is formed of a resin made of a carbon or a pigment dispersed in an acryl resin. For example, such a material having a viscosity of about 20 cp is spin-coated on the transparent insulating substrate 51 to have a film thickness of about 1.5 μm and then, the material is developed. In this case, the black matrix is not formed on a portion of the substrate 51 in which a contact through hole will be formed in a later step.

An overcoat layer 65 is coated to flatten the surface of the substrate 51 and developed to have a first opening 66 therein. The substrate 51 is baked for 60 minutes at a temperature of 220 to 230° C. to cure the overcoat layer 15. In this case, the overcoat layer is melted by the baking to have a cross sectional profile shaped like an arch having a large curvature (FIG. 2A).

Then, a novolac-type photoresist 67 is coated and patterned to have a second opening 68 therein. Thereafter, the passivation film 58 is etched using the novolac type photosensitive resist 67 as a mask, thereby forming a third opening 69 in the passivation film 58 (FIG. 2B)

After completion of formation of the overcoat layer 65 and third opening 69, the novolac-type photoresist 67 is removed and a transparent conductive film to serve as a pixel electrode is formed covering the aforementioned components by sputtering a transparent material, and then, the transparent conductive film is patterned to form a pixel electrode 70 (FIG. 2C). In this case, when the transparent conductive film is formed thicker, the pixel electrode 70 can more securely cover the associated portions to thereby achieve stable electrical connection between the pixel electrode 70 and the drain electrode 57. However, in consideration of ease of operation for processing an ITO (indium-tin-oxide) film, it is preferable to deposit the ITO (indium-tin-oxide) film to a film thickness of about 100 nm.

According to this conventional example, the novolac type photosensitive resist is coated on the overcoat layer shaped like an arch and patterned to form an opening in the passivation film through the patterned resist, so that the pixel electrode and the drain electrode can be connected through the opening. In this case, the second opening 68 is designed to include the first opening 66 therein while having 1 μm alignment allowance with respect to the first opening 66. However, actually in an alignment step, the second opening 68 is occasionally positioned inside the first opening 66 owing to variation caused during manufacturing process. This phenomenon makes an inner wall surface of the second opening 68 of the novolac type photosensitive resist stand in a direction substantially vertical to the surface of the substrate 51 along the first opening 66 of the overcoat layer at an interface between the resist and the passivation film. Therefore, in this portion, a cross sectional profile of the third opening of the passivation film is substantially vertical to the surface of the substrate 51, contributing to degradation of cross sectional profile of the pixel electrode along the third opening 69 and then, unfavorably generating an unstable connection resistance between the pixel electrode and the drain electrode.

SUMMARY OF THE INVENTION

An object of the present invention is to provide a method for manufacturing an active matrix substrate, in more detail, a TFT substrate having a color filter thereon, the method allowing connection between a source/drain electrode and a pixel electrode connected thereto to stably become low.

A method for manufacturing an active matrix substrate constructed in accordance with the present invention can be performed in the following steps. That is, a thin film transistor and a wiring are formed on a transparent insulating substrate, and a protective film covering the thin film transistor and the wiring are formed on the transparent insulating substrate, and then, a first photosensitive film is formed on the protective film exposed therefrom, the first photosensitive film having a first opening to expose a portion of the first region of the protective film. Thereafter, a second photosensitive film is formed on the first photosensitive film with a second opening positioned inside the first opening to expose a part of the protective film and a third opening is formed in the protective film. In this case, the third opening is formed by removing the part of the protective film to expose a portion of the wiring by using the second photosensitive film as a mask such that an edge of the third opening is apart from an inner wall of the first opening, removing the second photosensitive film to expose the first photosensitive film by a distance equal to at least a film thickness of the second photosensitive film. Then, a conductive film is formed on the first photosensitive film so as to be connected to the wiring through the third opening and finally, a pattern is formed in the conductive film to form an upper layer wiring made of the conductive film.

As described above, in a case where the second opening is formed in the second photosensitive film to have a tapered cross sectional profile, the third opening also can be formed in the protective film to have a tapered cross sectional profile, allowing for stable connection between a wiring and an upper layer wiring connected to each other through the third opening.

BRIEF DESCRIPTION OF THE DRAWINGS

FIGS. 1A, 1B and 1C are cross sectional views of a conventional active matrix substrate, illustrating a conventional method for manufacturing an active matrix substrate in order of manufacturing steps;

FIGS. 2A, 2B and 2C are cross sectional views subsequent to the step of FIG. 1C;

DETAILED DESCRIPTION OF THE PREFERRED EMBODIMENTS

A first embodiment of this invention will be described with reference to FIGS. 3 to 8.

Figure 3:
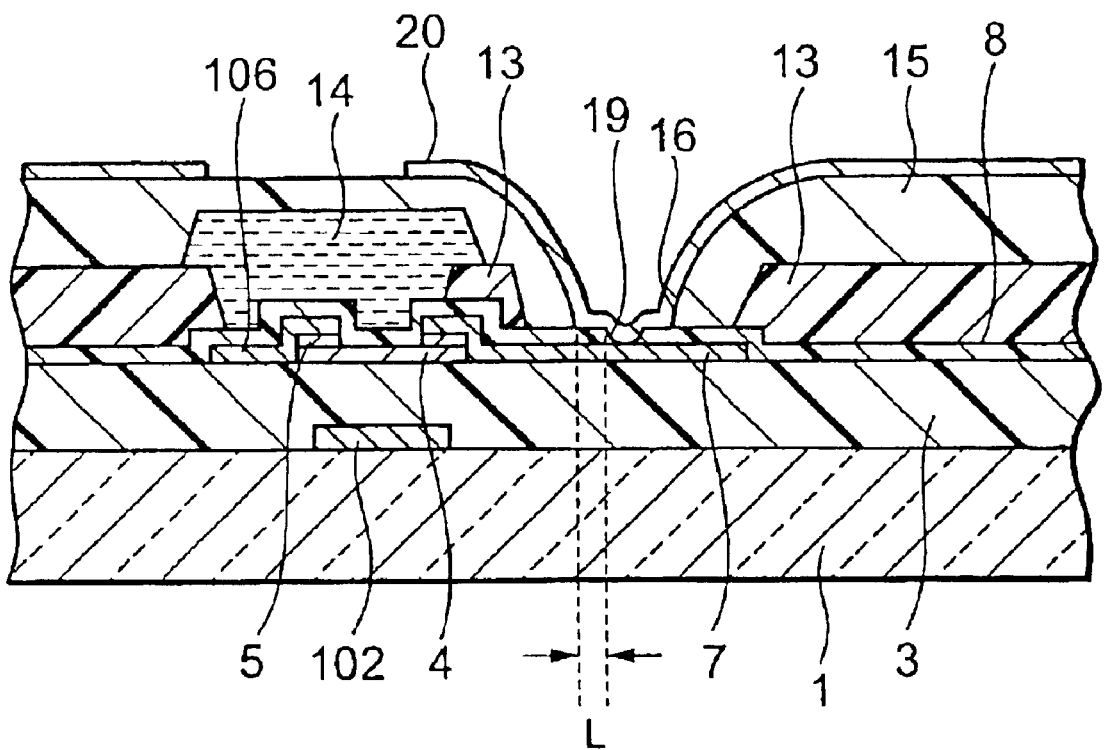
FIG. 3 is a cross sectional view of an active matrix substrate constructed in accordance with the first to fourth embodiments of the present invention.

Referring to FIG. 3, a gate electrode 102 is formed on a transparent insulating substrate 1 and a gate insulating film 3 is formed covering the gate electrode on the substrate 1. On the gate insulating film 3 is formed a semiconductor layer 4 facing the gate electrode 102 and a drain electrode 106 and a source electrode 7 formed on the central portion of the semiconductor layer 4 while being apart from each other are connected to the semiconductor layer 4 via ohmic contact layers 5, respectively. In this case, the ohmic contact layers 5 are formed only between the semiconductor layer 4 and the source and drain electrodes 106 and 7 by etching and removing the portion of the ohmic contact layer between the source and drain electrodes 106 and 7.

A passivation film 8 is formed covering a channel portion of the TFT, which portion is formed by removing the associated portion of the ohmic contact layer, on the substrate 1 and having a third opening 19 therein to connect the source electrode 7 and a pixel electrode 20 to each other.

The positional relationship between the third opening 19 and a first opening 16 of an overcoat layer becomes so important when forming the third opening 19 to have a tapered wall therein. As shown in FIG. 3, in a case where the third opening 19 is positioned apart less than 2 $\mu$m from the first opening 16 of the overcoat layer 15, the following phenomenon could probably be observed. That is, a second opening is formed in a novolac type photosensitive resist 17 to have a cross sectional profile shaped like an arch as a result of influence of a cross sectional profile of the first opening 16 of the overcoat layer 15 (refer to the second opening 68 shown in FIG. 2B). Accordingly, the cross sectional profile of the second opening of the novolac type photosensitive resist 17 becomes substantially vertical to the substrate at the boundary between the resist and the passivation film 8 and thus, the third opening 19 is formed in the passivation film 8 not to have a tapered cross sectional profile.

On the passivation film 8 excluding the third opening 19 and corresponding to the display region of each pixel is formed a color filter 13 representing any one color of R, G and B. In addition, a black matrix 14 is formed on a part of the passivation film 8 corresponding to the gate line including a TFT and an overcoat layer 15 is formed on a part, excluding the third opening 19, of the passivation film.

Figure 4:
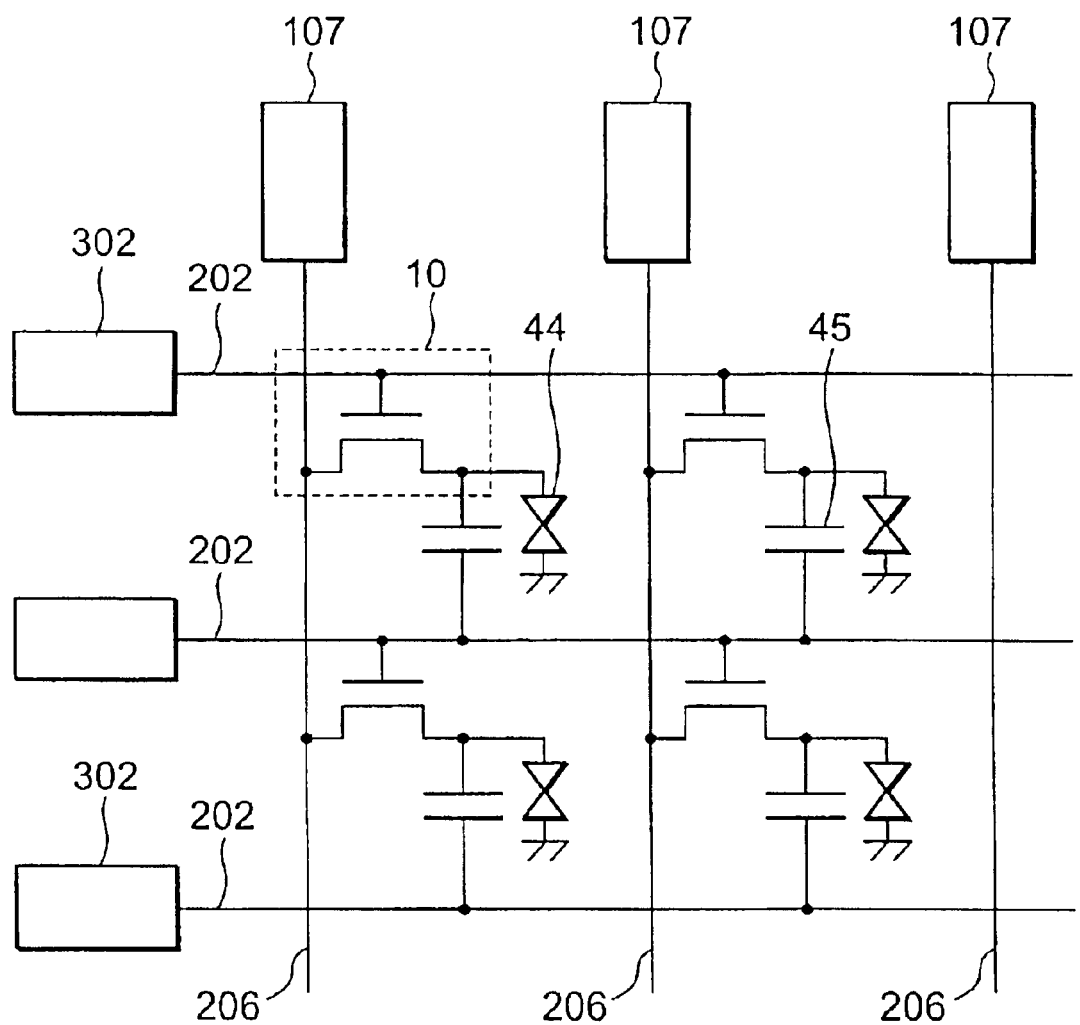
FIG. 4 is a circuit diagram of an active matrix substrate.

FIG. 4 is a circuit diagram of an active matrix substrate. A gate line 202 extends from a gate terminal 302 and is connected to a gate electrode of a TFT 10 that constitutes one of pixels arranged in a matrix. On the other hand, from a drain terminal 107 extends a drain line 206 that supplies signals to the TFT 10. A liquid crystal 44 is injected into a space between an active matrix substrate and an opposing substrate disposed facing the active matrix substrate and the pixel electrode of each pixel and a common electrode formed on the opposing substrate constitute a pixel capacitor 45 interposing the liquid crystal 44 therebetween as a dielectric material.

FIGS. 6 to 8 illustrate manufacturing steps constructed in accordance with a first embodiment of the present invention.

Figure 6A:
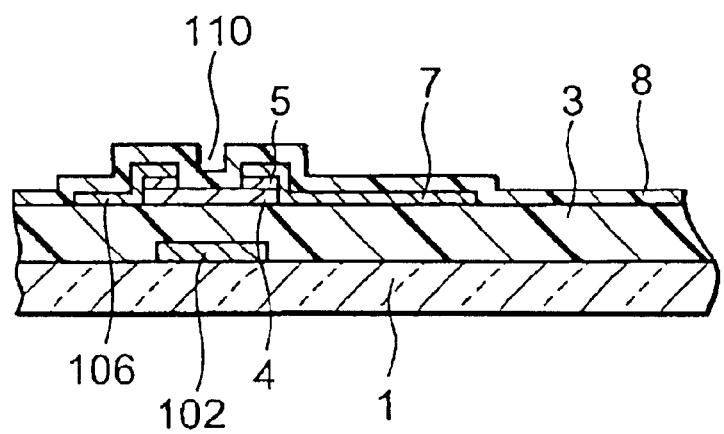
FIGS. 6A, 6B and 6C are cross sectional views of a conventional active matrix substrate, illustrating a method for manufacturing an active matrix substrate constructed in accordance with the first to fourth embodiments of the present invention in order of manufacturing steps.

As FIG. 6A shows, on a transparent insulating substrate 1 are formed a gate electrode 102, a gate insulating film 3, a semiconductor layer 4, an ohmic contact layer 5, a drain electrode 106, a source electrode 7 and a passivation film 8.

Figure 6B:
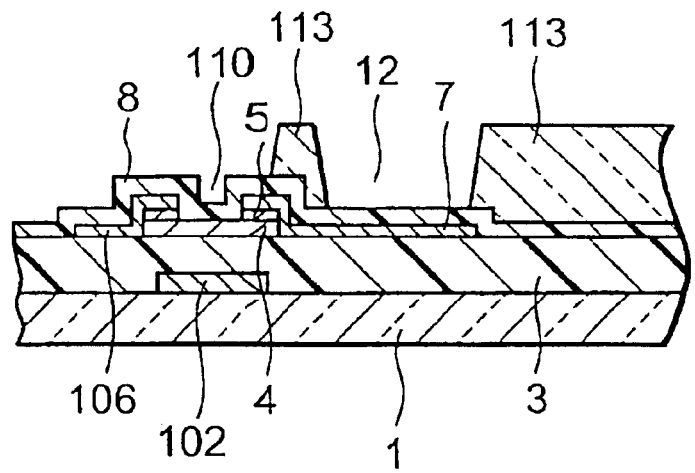

Then, as shown in FIG. 6B, a photocurable acryl resin obtained by dispersing a pigment in a solvent and soluble to an alkali developer is used as a color resist and the color resist is spin-coated on the substrate to a thickness of about 1.2 $\mu$m. After heating the substrate at a temperature of 80° C. for two minutes as a pre-baking step, the resist is exposed and developed in an alkali developer (TMAH). In this case, the color resist is not formed on a portion 12 of the passivation film 8 in which the third opening will be formed in a later step, as shown in FIG. 6B.

The substrate having the patterned color resist thereon is placed in an oven previously heated to 220° C. to cure the color resist. Through these steps, a red color filter 113 is formed. In this embodiment, a black matrix is not formed prior to formation of the red color filter and therefore, residue of red color filter 113 never generates. The reason is as follows. That is, in a case where an organic film such as a black matrix consisting of the same material as that constituting the red color filter has been formed prior to formation of the red color filter 113, the red color filter 113 is formed adhesively on an underlying layer to thereby occasionally generate residue of the filter thereon.

Figure 6C:
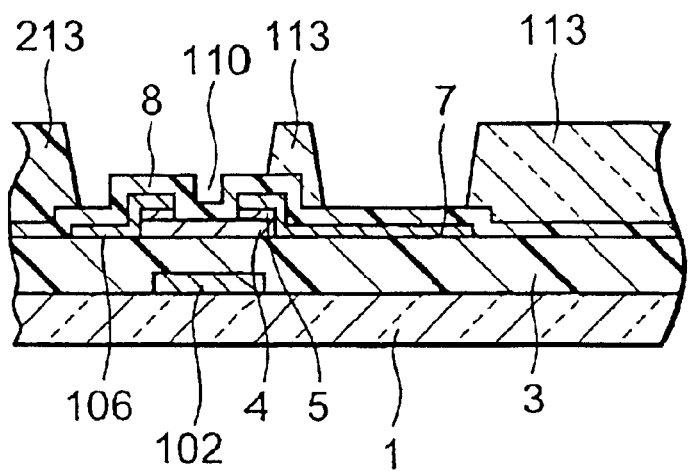
Figure 7A:
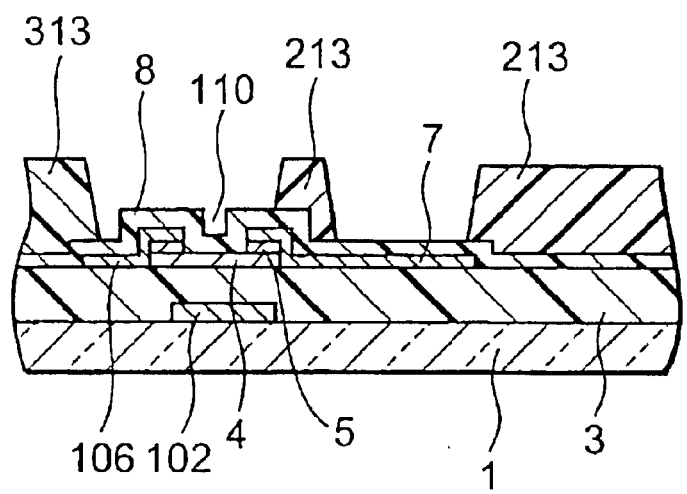
FIGS. 7A, 7B and 7C are cross sectional views subsequent to the step of FIG. 6C.
Figure 7B:
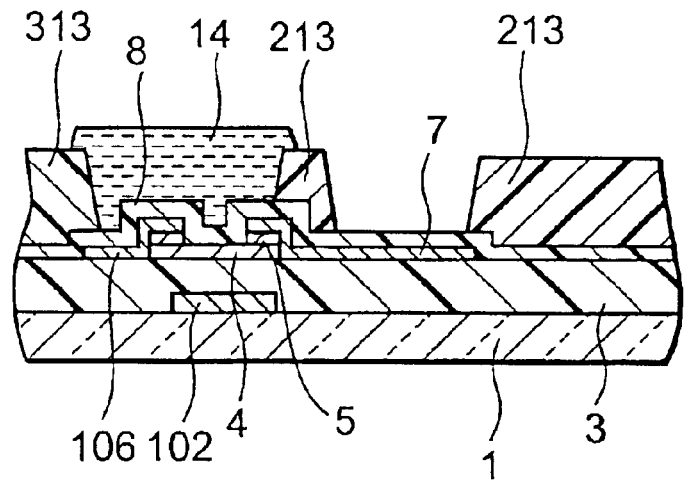

After a green color filter 213b (FIG. 6C) and a blue color filter 313 (FIG. 7A) are formed in the same manner as that employed to form the red color filter, a black matrix 14 is formed to shield a transistor and other peripheral portion to be shielded in a pixel from a light (FIG. 7B). The black matrix 14 is used as a resin black matrix obtained by dispersing carbon or a pigment in an acryl resin. In this embodiment, a material having a viscosity of about 20 cp is spin-coated on the substrate to a thickness of about 1.5 μm and then, patterned so as not to form the black matrix 14 on a part of the passivation film in which the third opening is formed.

After the passivation film 8 whose specific surface around the later-formed third opening is exposed to the outside is subjected to surface treatment, the overcoat layer 15 is coated on the substrate and then, developed to form the first opening 16 in the overcoat layer 15 while exposing the later-formed third opening of the passivation film. The surface treatment is applied to the passivation film 8 to improve adhesion of the overcoat layer to the passivation film and is performed by using a silane coupling agent.

Figure 8A:
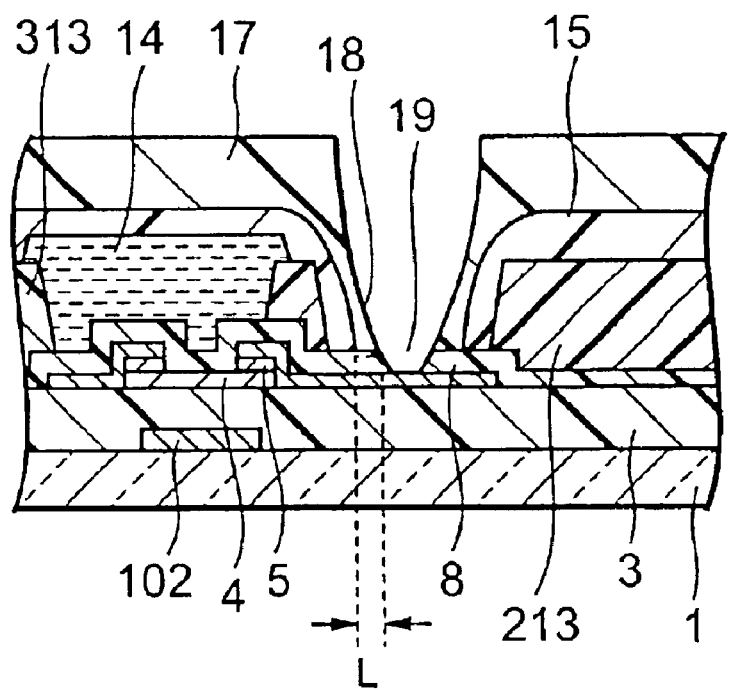
FIGS. 8A and 8B are cross sectional views subsequent to the step of FIG. 7C.

A novolac type photosensitive resist 17 is coated on the substrate to have a film thickness of 1.5 to 4.0 μm and then, developed to have an associated pattern, and further, the passivation film 8 is etched using the novolac type photosensitive resist 17 as a mask (FIG. 8A). In this case, the positional relationship between the second opening 18 of the novolac type photosensitive resist 17 and the first opening of the overcoat layer 15 becomes so important when forming the second opening 18 with a tapered cross sectional profile in the novolac type photosensitive resist 17.

As shown in FIG. 8A, the second opening 18 should be apart at least a distance equal to the film thickness of the novolac type photosensitive resist 17, i.e., "L," from the first opening 16 of the overcoat layer 15 (in a case where the novolac type photosensitive resist 17 is coated to a thickness of 1.5 μm, the spacing between the second opening 18 and the first opening 16 is designed to be 2.0 μm to allow the second opening 18 to securely be aligned with the first opening 16). Otherwise, the following unfavorable phenomenon will occur. That is, the second opening 18 of the novolac type photosensitive resist 17 is formed to have a cross sectional profile shaped like an arch as a result of influence of a cross sectional profile of the first opening 16 of the overcoat layer 15. Accordingly, the cross sectional profile of the second opening 18 of the novolac type photosensitive resist 17 becomes substantially vertical to the substrate along the first opening at the boundary between the resist and the passivation film 8 and thus, the third opening 19 formed in the passivation film 8 could not have a tapered cross sectional profile.

In addition, the post-baking has to be carried out for 3 to 10 minutes at a temperature of 20 to 120° C. to evaporate the solvent of the novolac type photosensitive resist 17 after the resist has been developed. Thus, the second opening can be formed in the novolac type resist 17 ed to have a tapered cross sectional profile at the boundary between the resist and the passivation film 8 and therefore, the passivation film 8 is etched to have the third opening 19 therein with a tapered cross-sectional profile. The third opening 19 constructed as described above makes it possible to keep a connection resistance between the pixel electrode 20 and the source electrode 7 low and obtain a high quality active matrix substrate.

As described above, a first aspect of the method for manufacturing an active matrix substrate constructed in accordance with the present invention is characterized in that in a step for forming a contact hole in a passivation film after formation of an overcoat layer in a case where a resin black matrix, a color resist and an overcoat layer are used to form a color filter on a TFT substrate, i.e., an active matrix substrate, a novolac type photosensitive resist is formed to have a tapered cross sectional profile without suffering from influence of the first opening with an arch-shaped cross sectional profile formed in the overcoat layer.

The method for manufacturing an active matrix substrate constructed in accordance with the present invention is also so effective in manufacturing an active matrix substrate including neither black matrix nor color resist and therefore, can be applied to any substrate constructed by forming an overcoat layer made of an organic film on a TFT substrate.

The method constructed in accordance with the first embodiment will be described in more detail below. FIGS. 6 to 8 illustrate cross sectional views of an active matrix substrate cut along the lines A-A' of FIG. 5A in order of manufacturing steps.

First, a channel-etching-type TFT 110 is formed on a transparent insulating substrate 1 and a passivation film 8 is formed covering the channel-etching-type TFT 110 on an entire surface of the substrate 1. The passivation film 8 may be formed of, for example, a silicon nitride film formed by plasma CVD (FIG. 6A).

Subsequently, a negative type photocurable color resist obtained by dispersing a red pigment in an acryl resin is spin-coated on the transparent insulating substrate. The rotational speed of a spinner is adjusted to make a film thickness of the resist about 1.2 μm. Then, the substrate having the resist formed thereon is heated on a hot plate for two minutes at a temperature of 80° C. in a pre-baking step, and exposed and further, developed in a TMAH solution (tetramethylammonium hydroxide) to form a red color filter 113 in an associated portion on the substrate. In this case, the red color filter 113 is not formed on a part 12 of the passivation film 8 in which a third opening will be formed later. Then, the substrate is baked in a clean oven for 60 minutes at a temperature of 220° C., to cure the red color filter 113 (FIG. 6B).

Thereafter, a green color filter 213 is formed in a pixel different from the pixel, in which the red color filter is formed, in accordance with the same manner as in the case where the red color filter has been formed. The substrate is baked in an oven for 60 minutes at a temperature of 220° C. to obtain the green color filter 213 (FIG. 6C). A blue color filter 313 is also formed in accordance with the same manner as in the case where the red color filter has been formed.

Subsequently, after formation of color filters, a black matrix 14 is formed. The black matrix 14 is formed of a resin made of a carbon or a pigment dispersed in an acryl resin. In the embodiment, such a material having a viscosity of about 20 cp is spin-coated on the transparent insulating substrate to a film thickness of about 1.5 μm and then, the material is developed. In this case, the black matrix is not formed on a portion of the substrate in which the third opening will be formed in a later step (FIG. 7B).

Figure 7C:
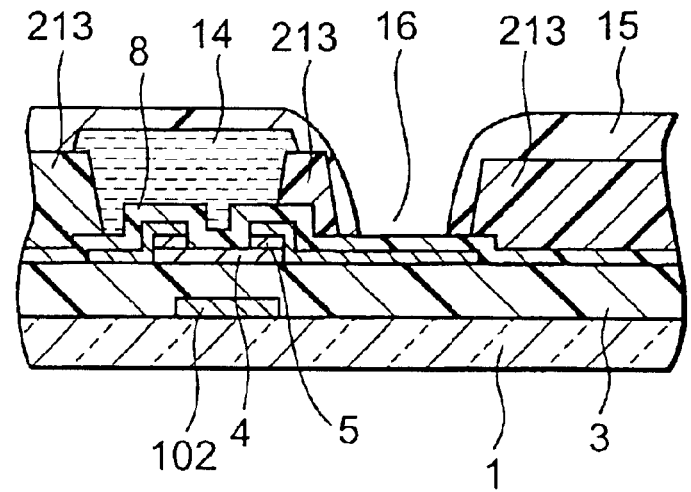

An overcoat layer 15 is coated and developed to remove a part thereof, through which the third opening will be formed in the passivation film, to form a first opening 16 therein. The substrate is baked for 60 minutes at a temperature of 220° C. to cure the overcoat layer 15. During the development step, since the allowance for a degree of development of the overcoat layer is small, when a PH of a developer solution fluctuates, the overcoat layer is occasionally side-etched to make the cross sectional profile of the second opening substantially vertical to the substrate around the passivation film 8. To prevent such phenomenon, the overcoat layer is subjected to an interim-baking for at least three minutes at a temperature of 120 to 160° C. This step makes the overcoat layer have a tapered cross sectional profile of the second opening even after the overcoat layer is side-etched (FIG. 7C).

Then, a novolac-type photoresist 17 is coated to a film thickness of 1.5 to 4.0 μm and patterned to have a second opening 18 therein. In this case, in a case where the novolac type photosensitive resist 17 is coated to a film thickness of 1.5 μm, the spacing between the first opening 16 and the second opening 18 is designed to be 2.0 μm to allow the second opening 18 to securely be aligned with the first opening 16. Accordingly, when both the first opening 16 and the second opening 18 are formed in accordance with a designed pattern, the spacing therebetween becomes a designed value of 2.0 μm.

Thereafter, the passivation film 8 is etched using the novolac type photosensitive resist 17 as a mask (FIG. 8A). In this case, the novolac type photosensitive resist has to be subjected to post-baking at a temperature of equal to or less than 120° C. to evaporate the solvent of the novolac type photosensitive resist after development of the resist.

If the post-baking were performed at a temperature of equal to or greater than 120° C., the novolac type photosensitive resist would begin to melt to have a cross sectional profile forming a sequential curve together with the arched-cross sectional profile of the overcoat layer. Accordingly, since the second opening 18 of the novolac type photosensitive resist 17 would have a cross sectional profile substantially vertical to the substrate, the third opening 19 formed in the passivation film 8 would also have a cross sectional profile substantially vertical to the substrate. In the event the third opening 19 is formed to have such a cross sectional profile, a pixel electrode would successively be formed thereon poorly covering the third opening 19 to resultantly increase a contact resistance between the source electrode and the pixel electrode.

Figure 8B:
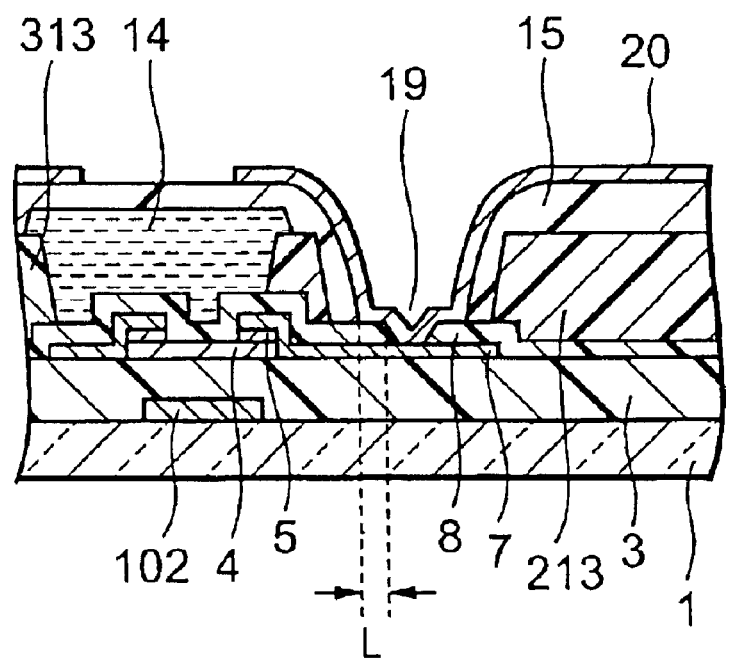

After removal of the novolac type photosensitive resist 17, a transparent conductive film to serve as a pixel electrode is formed covering the overcoat layer 15 and the third opening 19 of the passivation film 8 by sputtering a transparent conductive material over the aforementioned components and then, patterning the material. In this case, although stable connection between the source electrode 7 and the pixel electrode in addition to desirable cross sectional profile of the pixel electrode covering the hole can be obtained in proportion to a film thickness thereof, the film thickness thereof is preferably selected to be about 100 nm in terms of easiness to process ITO (Indium-Tin-Oxide) film as a transparent conductive film. The ITO film is then patterned to form a pixel electrode 20 (FIG. 8B).

The above-described method makes it possible to manufacture a liquid crystal display device having a higher aperture ratio to allow the device to display images brighter with high reliability compared to the device manufactured by the conventional method.

The first embodiment can provide a primary advantage as follows. That is, electrical connection between the pixel electrode and the source electrode 7 though the third opening of the passivation film can be obtained with high reliability and therefore, yield and reliability of a liquid crystal display device can be improved to an extreme extent. This advantage can be realized by controlling a cross sectional profile of the second opening 18 formed in the novolac type resist 17 so as not to be affected by the arched cross sectional profile of the first opening 16 of the overcoat layer 15 before etching the passivation film 8 by using the second opening 18 of the novolac type resist 17 as a mask to form the third opening 19 in the passivation film 8.

A second embodiment of the present invention will be described with reference to FIG. 8A.

This embodiment is constructed such that a TFT substrate is manufactured through the steps consisting of the steps excluding the post-baking, which is performed in the step shown in FIG. 8A, from the steps employed in the first embodiment. This construction of steps also makes it possible to form a second opening 18 in a novolac type photosensitive resist 17 to have a tapered cross sectional profile thereof at a boundary between a passivasion film 8 and the resist. In this case, to evaporate the solvent left in the resist, a substrate having the resist thereon may be subjected to drying under reduced pressure. Thus, an active matrix substrate of the second embodiment can be manufactured.

A third embodiment of the present invention will be described with reference to FIG. 8A.

This embodiment is constructed such that a TFT substrate is manufactured through the steps in which the surface of a passivation film 8 is processed in the step shown in FIG. 8A to make a novolac type photosensitive resist 17 more adhesive to the passivation film before the resist is coated on the passivation film. This construction of steps makes it possible to make development rate of novolac type photosensitive resist low at a boundary between the passivaton film and the resist at the time of development of the novolac type photosensitive resist 17, thereby forming a second opening 18 formed in the novolac type photosensitive resist 17 to have a tapered cross sectional profile. The material such as a silane coupling agent is preferably selected as an interface processing agent for improving adhesion of the resist.

A fourth embodiment of the present invention will be described with reference to FIG. 8A.

This embodiment is constructed such that a TFT substrate is manufactured through the steps in which a novolac type photosensitive resist 17 is exposed in the step shown in FIG. 8A to an extent becoming gradually larger toward periphery of a later-formed third opening of a passivation film 8 by using a half-tone mask or a gray-tone mask after coating the resist 17. In other words, the resist 17 is exposed to an extent becoming gradually larger toward the center of a second opening 18 to thereby form the second opening 18 in the novolac type photosensitive resist to have a tapered cross sectional profile. This construction of steps makes it possible to form a third opening 19 to have a tapered cross sectional profile since the passivation film 8 is undercut along the tapered cross sectional profile of the second opening 18 of the novolac type photosensitive resist 17.

Figure 5A:
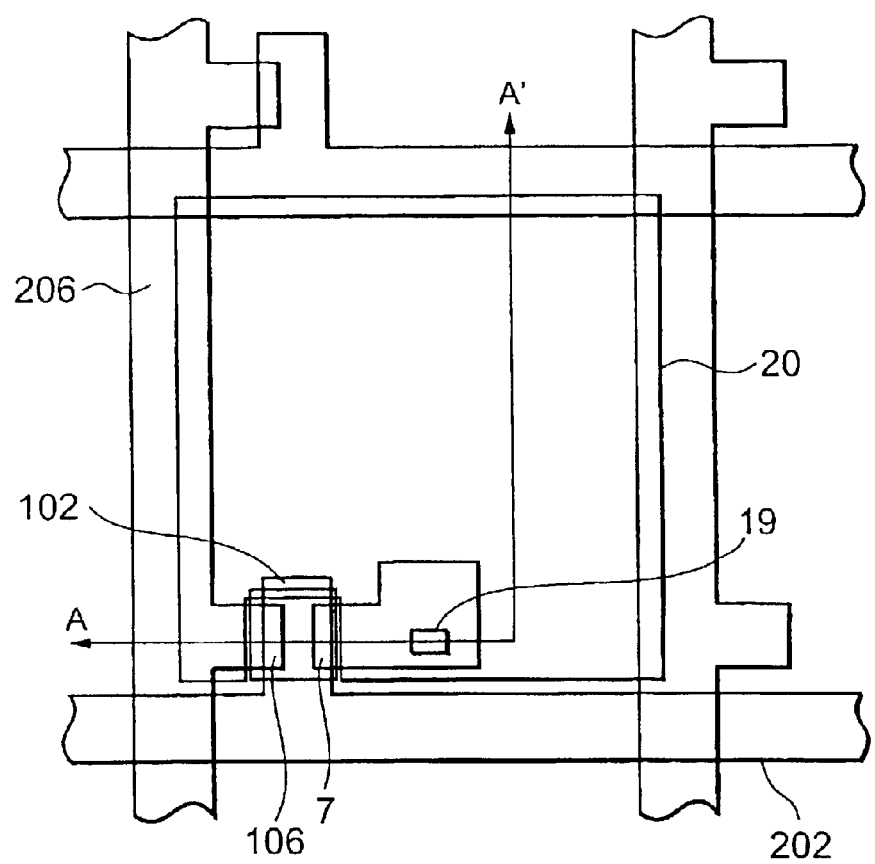
FIG. 5A is a plan view of a pixel of the active matrix substrate employed in the method for manufacturing the active matrix substrate according to the present invention.
Figure 5B:
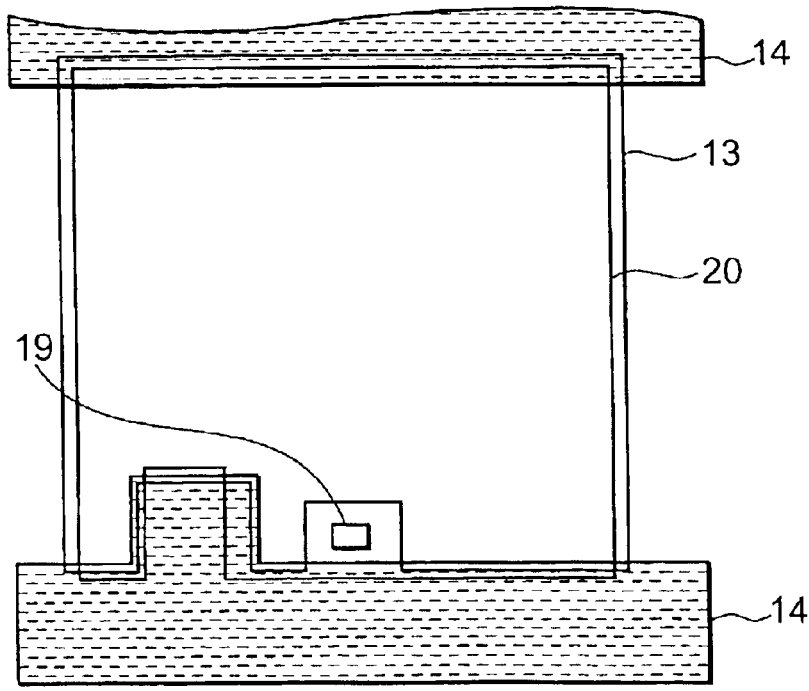
FIG. 5B is a plan view of a pixel of the active matrix substrate, illustrating the position of a black matrix within the pixel.
Figure 9A:
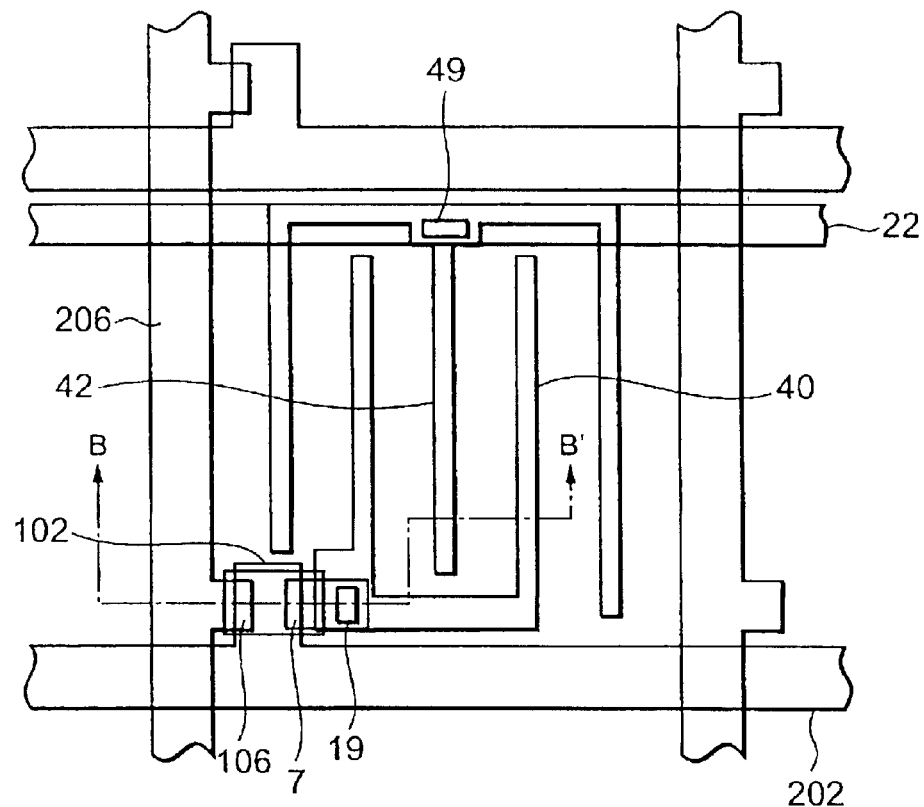
FIG. 9A is a plan view of a pixel of the active matrix substrate manufactured in accordance with the fifth embodiment of the present invention and FIG. 9B is a cross sectional view of the same substrate cut along the line B-B' of FIG. 9A.
Figure 9B:
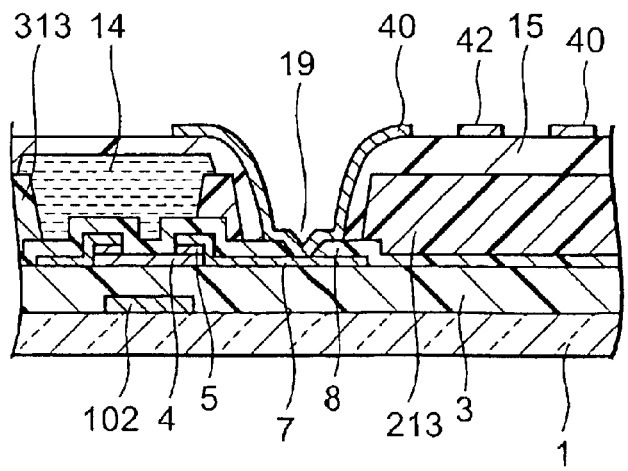

A fifth embodiment of the present invention will be described with reference to FIGS. 9A and 9B. FIG. 9A is a plan view of a TFT substrate corresponding to one pixel constructed in accordance with the fifth embodiment of the present invention, omitting a color filter and a black matrix for simplicity since substantially the same figure as that of FIG. 5A is employed in FIG. 9A. FIG. 9B is a cross sectional view thereof taken along the line B-B' of FIG. 9A. This embodiment is an example constructed by applying the first to fourth embodiments to a TFT substrate using a lateral electric field. In the embodiment, the TFT substrate is constructed such that comb-shaped pixel electrode and common electrode are formed on an overcoat layer after formation of passivation film, color filter, black matrix, first and third openings, and overcoat layer, those components also being formed in the first embodiment. Therefore, the method employed in the embodiment can be explained referring to the same figures as those shown in FIGS. 6A through 7C, all of which are used to explain the first embodiment. In addition, as shown in FIG. 9A, a common electrode 22 is formed together with a gate wiring 2b on a transparent insulating substrate 1.

As shown in FIG. 7C, a first opening 16 is formed in the overcoat layer 15 above a source electrode 7. In addition to the first opening 16, an opening is formed in the overcoat layer 15 on the common electrode 22 to connect the common electrode 22 to an upper layer common electrode 42, as shown in FIG. 9A.

Subsequently, using the same step as in the first embodiment, a passivation film 8 is etched to form a third opening 19 therein on the source electrode 7 by using a novolac type photosensitive resist as a mask while etching another portion of the passivation film 8 to form a fourth opening 49 therein for connecting the common electrode to the upper layer common electrode 42. Then, Cr is deposited by sputtering on the overcoat layer 15 and patterned to form a comb-shaped pixel electrode 40 and the comb-shaped upper common electrode 42 (FIGS. 9A and 9B).

According to the embodiment, it is possible to securely connect the pixel electrode 40 and the source electrode 7 together, as well as the upper common electrode 42 and the common electrode 22 together, thereby improving yield and reliability of a lateral electric field type liquid crystal display device to an extreme extent. Those advantages are realized by controlling a cross sectional profile of the second opening 18 formed in the novolac type resist 17 so as not to be affected by the arched cross sectional profile of the first opening 16 of the overcoat layer 15 before etching the passivation film 8 by using the second opening 18 of the novolac type resist 17 as a mask to form the third and fourth openings 19, 49 in the passivation film 8.

As described above, the method for manufacturing an active matrix substrate constructed in accordance with the present invention includes forming a passivation film so as to cover a TFT, forming a color filter and an overcoat layer covering the color filter on the passivation film, and forming contact through holes (the third and fourth openings) in the passivation film to connect a source/drain electrode and a pixel electrode. In this case, the contact through hole (the third opening) is formed to have a tapered cross sectional profile to make a connection resistance between the source/drain electrode and the pixel electrode stably low. To form the contact through hole having such a tapered cross sectional profile, the spacing between the contact through hole (the third opening) of the passivation film and an opening (the first opening) of the overcoat layer is designed to be equal to or greater than 2.0 μm, so that an opening (the second opening) of the novolac type photosensitive resist available for use as an etching mask in forming a contact through hole (the third opening) in the passivation film is patterned to have a tapered cross sectional profile. This construction of the novolac type photosensitive resist makes it possible to form a contact through hole (the third opening) having a tapered cross sectional profile in the passivation film and then, connect the pixel electrode, which sufficiently covers the contact through hole (the third opening), to the source/drain electrode, thereby enabling to stably connect both electrodes together via a low resistance.

Finally, it should be understood that although all of the embodiments of the present invention describe the TFT substrate as a TFT substrate having a color filter thereon, application of the present invention is not limited to such construction of TFT substrate and therefore, may be deployed to a TFT having no color filter thereon.

What is claimed is:

1. A method for manufacturing an active matrix substrate comprising the steps of:

forming a thin film transistor and a wiring on a transparent insulating substrate;

forming a protective film covering said thin film transistor and said wiring on said transparent insulating substrate;

forming a first photosensitive film on said protective film exposed therefrom, said first photosensitive film having a first opening to expose a portion of a first region of said protective film;

forming a second photosensitive film on said first photosensitive film with a second opening positioned inside said first opening to expose a part of said protective film;

forming a third opening in said protective film by removing said part of said protective film to expose a portion of said wiring by using said second photosensitive film as a mask such that an edge of said third opening is apart by a distance equal to at least a film thickness of said second photosensitive film from an inner wall of said first opening;

removing said second photosensitive film to expose said first photosensitive film;

forming a conductive film on said first photosensitive film so as to be connected to said wiring through said third opening; and forming a pattern in said conductive film to form an upper layer wiring made of said conductive film.

2. The method for manufacturing an active matrix substrate according to claim 1, wherein a film thickness of said second photosensitive film ranges from 1.5 to 4.0 μm.

3. The method for manufacturing an active matrix substrate according to claim 1, wherein said first photosensitive film is formed by: coating a first photosensitive film on said protective film; exposing and developing said first photosensitive film; baking said first photosensitive film for 3 to 10 minutes at a temperature of 120 to 160° C. as an interim-baking step; and baking said first photosensitive film at a temperature of 220 to 230° C. in a step for forming said first photosensitive film as a post-baking step.

4. The method for manufacturing an active matrix substrate according to claim 1, wherein said first photosensitive film is formed by processing a surface of said protective film to make said first photosensitive film more adherent to said surface of said protective film and then, forming said first photosensitive film on said protective film in a step for forming said first photosensitive film.

5. The method for manufacturing an active matrix substrate according to claim 1, wherein said second photosensitive film is formed by processing a surface of said protective film to make said second photosensitive film more adherent to a surface of said protective film, said surface of said protective film being exposed to the outside through said first opening, and then, forming said protective second photosensitive film on said first photosensitive film in a step for forming said second photosensitive film.

6. The method for manufacturing an active matrix substrate according to claim 1, wherein said second photosensitive film is formed by: coating a novolac type photosensitive film on said first photosensitive film; exposing and developing said novolac type photosensitive film; and heating said novolac type photosensitive film for 3 to 10 minutes at a temperature of 20 to 120° C. to form a tapered side surface in said second opening in a step for forming said second photosensitive film.

7. The method for manufacturing an active matrix substrate according to claim 1, wherein said second photosensitive film is formed by exposing a part of said second photosensitive film varying an amount of a light to be irradiated, said part corresponding to a later-formed second opening, to thereby form a tapered side surface in said second opening after coating said novolac type photosensitive film on said first photosensitive film in a step for forming said second photosensitive film.

8. The method for manufacturing an active matrix substrate according to claim 1, wherein said second photosensitive film is formed by: coating a novolac type photosensitive film on said first photosensitive film; exposing and developing said novolac type photosensitive film; and subjecting said second photosensitive film to drying under reduced pressure to evaporate solvent included in said second photosensitive film.

9. The method for manufacturing an active matrix substrate according to claim 1, wherein said wiring includes a gate electrode, a gate wiring, a common wiring, a source/drain electrode and a common electrode, said gate electrode constitutes a part of said gate wiring, said common electrode is connected to said common wiring formed together with said gate wiring, said third opening is formed on said source/drain electrode, and said upper layer wiring includes a pixel electrode connected to said source/drain electrode via said third opening and further, a common electrode connected to said common wiring via another third opening formed on said common wiring and disposed apart a predetermined distance from said pixel electrode and in parallel with said pixel electrode.

10. The method for manufacturing an active matrix substrate according to claim 1, wherein a color filter is selectively formed on said protective film to expose a first region of said protective film positioned on said wiring between said step for forming a protective film covering said thin film transistor and said wiring on said transparent insulating substrate and said step for forming a first photosensitive film on said protective film.

* * * * *